United States Patent
Prengel et al.

(10) Patent No.: US 7,271,495 B2
(45) Date of Patent: Sep. 18, 2007

(54) CHIP BOND LAYOUT FOR CHIP CARRIER FOR FLIP CHIP APPLICATIONS

(75) Inventors: Helmut Prengel, Burkau (DE); Frank Schneider, Radeberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 105 days.

(21) Appl. No.: 11/135,720

(22) Filed: May 24, 2005

(65) Prior Publication Data

US 2006/0076691 A1     Apr. 13, 2006

(30) Foreign Application Priority Data

Sep. 30, 2004    (DE)    .................. 10 2004 047 753

(51) Int. Cl.
*H01L 23/48* (2006.01)

(52) U.S. Cl. .................. 257/778; 257/781; 257/774; 257/E21.503; 257/E21.511

(58) Field of Classification Search ............. 257/778, 257/781, 774, E21.503, E21.511
See application file for complete search history.

(56) References Cited

U.S. PATENT DOCUMENTS

| | | | |
|---|---|---|---|
| 5,534,784 A * | 7/1996 | Lum et al. .................. 324/757 |
| 6,150,724 A * | 11/2000 | Wenzel et al. .............. 257/777 |
| 6,762,366 B1 | 7/2004 | Miller et al. ................. 174/250 |
| 6,774,498 B2 * | 8/2004 | Hsu et al. .................... 257/786 |
| 6,787,918 B1 * | 9/2004 | Tsai et al. .................... 257/778 |
| 6,933,615 B2 * | 8/2005 | Maeda ........................ 257/780 |
| 2003/0201528 A1 | 10/2003 | Hsu ............................ 257/691 |
| 2003/0201534 A1 * | 10/2003 | Eichelberger et al. ...... 257/737 |
| 2004/0017008 A1 * | 1/2004 | Ueda ........................... 257/734 |
| 2004/0178486 A1 * | 9/2004 | Maeda ........................ 257/678 |
| 2005/0130349 A1 * | 6/2005 | Sunohara .................... 438/108 |

FOREIGN PATENT DOCUMENTS

EP     0 921 567 A2    6/1999

* cited by examiner

*Primary Examiner*—Thao P. Le
(74) *Attorney, Agent, or Firm*—Williams, Morgan & Amerson, P.C.

(57) ABSTRACT

A chip carrier for flip chip applications, according to the present invention, provides peripheral bumps and inner bumps. The inputs and outputs related to the inner bumps are routed out on an additional wiring layer by means of vias. The proposed bond layout provides a high I/O count for a predefined chip size and a predefined carrier technology.

21 Claims, 3 Drawing Sheets

CHIP BOND LAYOUT FOR CHIP CARRIER FOR FLIP CHIP APPLICATIONS

CROSS-REFERENCE TO RELATED APPLICATION

This application claims the benefit of Germany Patent Application No. 10 2004 047 753.1, filed Sep. 30, 2004, the contents of which are hereby incorporated herein by reference in their entirety.

BACKGROUND OF THE INVENTION

1. Field of the Invention

The present invention relates to the field of the fabrication of semiconductor devices, and, more particularly, to an improved chip bond layout for chip carrier for flip chip bonding.

2. Description of the Related Art

As semiconductor manufacturers continue to scale down on-chip features, the need to contact those reduced size features becomes a more significant constraint. The scaled features enable increased functionality. For example, in general, the number of inputs and outputs (I/O count) of an integrated circuit may be increased while maintaining the die size or, on the other hand, the chip size may be reduced while maintaining the functionality (and the I/O count) of the original design for the integrated circuit. In both cases, however, the density of inputs and outputs (I/Os) is increased. For a conventional peripheral bond pad arrangement, the resulting bond pad pitch (the distance between the center of two adjacent bond pads) is accordingly reduced. Conventional wire bond technology provides a method to bond, by thermo-compression or by thermo-sonic-compression, a thin gold wire to a bond pad on the chip and to a bond pad on the carrier to form an electrical connection to the carrier for each input/output (I/O) of the chip. Wire bond technology may be employed with bond pad pitches down to 70 μm. Wire bonding, however, is a sequential process, so that the total bonding time increases and, hence, renders this bonding technology more and more ineffective, with increasing I/O counts. Furthermore, the curved wire bonds exhibit a high inductance so that wire bonds are, in general, not appropriate for high frequency applications, such as mobile telephones, wireless LANs, or state of the art microprocessors with high clock rates. Thus, primarily for electrical and/or economical reasons, wire bond technology is being replaced by the flip chip bond technology.

The flip chip technology requires an equal bump pitch on the chip and on the carrier to which the chip is to be bonded. The minimal bump pitch achievable on a carrier depends on the carrier material and on the corresponding available technology. As a chip carrier material, ceramics, polyimides or fiber-reinforced resins like FR4 may be employed. In large-scale production, FR4 is a widely used material for its economical benefits. Conventional FR4 printed circuit board (PCB) technologies are currently not capable of being reliably used with a bond pad pitch of less than 150 μm.

For flip chip bonding, solder bumps arranged according to the desired bump layout are formed on both the chip carrier and the chip to be bonded. Electro and electroless plating, evaporative techniques and stencil or screen-based printing technologies may be employed to deposit the solder bump material on the chip and on the carrier. A subsequent solder reflow brings the solder material into the required bump shape. In the bonding process, the bumps on the carrier and the corresponding bumps on the chip are disposed adjacent to each other by means of a flip chip bonder. In a heat treatment, the solder bumps on the chip and on the carrier are melted and the corresponding bumps form a single bond structure between the chip and the carrier. The chip may be released from the flip chip bonder when the solder is still in a liquid phase to achieve a certain self-alignment due to surface tension effects caused by the characteristics of the liquid solder. The remaining tiny gap between the chip and the carrier may be filled to reduce thermally-induced mechanical stress that may otherwise adversely affect the formed bond structure due to different thermal expansion coefficients of the materials of the chip and of the chip carrier.

Contrary to wire bonding, flip chip bonding is not restricted to the employment of peripheral bond pads. Consequently, semiconductor manufacturers arrange the bond pads in two or more rows disposed in the peripheral region of the chip area (peripheral array), or redistribute the peripheral bond pads over the entire chip area (area array) to allow for a higher bond pad pitch. The ratio of a single row peripheral pitch to the full area array pitch is independent of the chip size for square chips but exhibits a proportional relation to the square root of the number of I/Os. For example, for an I/O count of 100, the ratio of the peripheral pitch to the corresponding area array pitch is approximately 2.5, whereas, for an I/O count of 1600, the ratio increases to 10, i.e., in particular for high I/O counts, the area array redistribution of bump pads provides an effective manner to increase the required bond pad pitch. The sectional view of a system 100 depicted in FIG. 1 illustrates the technology according to a typical prior art technique. A chip 102 is flip chip bonded onto a carrier 106 by bonds 104. The I/Os of the chip 102 are routed out on the upper wiring layer 110 by means of conductive lines 108.

Disadvantageously, contrary to the peripheral arrangement, the area array bond pads are more difficult to route out on the chip carrier since the connection lines to inner bond pads are typically routed out in the clearances between the bond pads. For high I/O counts, the number of inner I/Os which are routed out is, in general, too high to route all inner I/Os out while still meeting the design rules of the employed board technology. In particular, for high power applications, it may be a challenging task to route out the power supply lines in accordance with the board design rules due to the typical high line width requirements required to meet the current density constraints. As a consequence, additional wiring layers have been integrated into the printed circuit board to route out the I/Os not routable on the upper wiring layer. Routing out on additional wiring layers, however, requires at least one via to connect each bump pad formed on the upper wiring layer. A via connecting two features on different wiring layers typically comprises a pad on each participating wiring layer and a hole drilled through the insulation layer between the wiring layers. The hole is subsequently filled by a conductive material to form a conductive connection between the pads. The pads extend beyond the diameter of the hole so that each via needs more free space as generally available in full area array layouts. Chip bond layouts need to be accordingly redesigned to allow for higher I/O counts. Currently available bond layouts, however, may suffer from a decreased number of routable I/Os.

In view of the above-mentioned problems, there exists a need for an improved bond layout for chip carrier for flip chip mounting.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment of the present invention, a chip carrier for flip chip bond application is provided. The chip carrier comprises a first and a second wiring layer. The chip carrier further comprises a plurality of bumps disposed on the first wiring layer, a first portion of the plurality of bumps representing peripheral bumps and being routed out by the first wiring layer and a second portion of the plurality of bumps representing inner bumps and being routed out by the first and second wiring layers. The peripheral bumps define a contiguous peripheral bump region surrounding the inner bumps.

In accordance with another illustrative embodiment of the present invention, a system is provided. The system comprises a semiconductor chip provided with a bump layout, and the chip is flip chip bonded to a chip carrier. The chip carrier comprises at least a first and a second signal layer, and the bump layout is arranged on the first signal layer. The bump layout comprises peripheral bumps disposed in a peripheral bump region of the chip, inner bumps disposed within the peripheral bump region in an inner bump region. The chip carrier further comprises a via region disposed within the peripheral bump region to dispose at least one via for each inner bump in the via region.

BRIEF DESCRIPTION OF THE DRAWINGS

The invention may be understood by reference to the following description taken in conjunction with the accompanying drawings, in which like reference numerals identify like elements, and in which.

Figure 1:
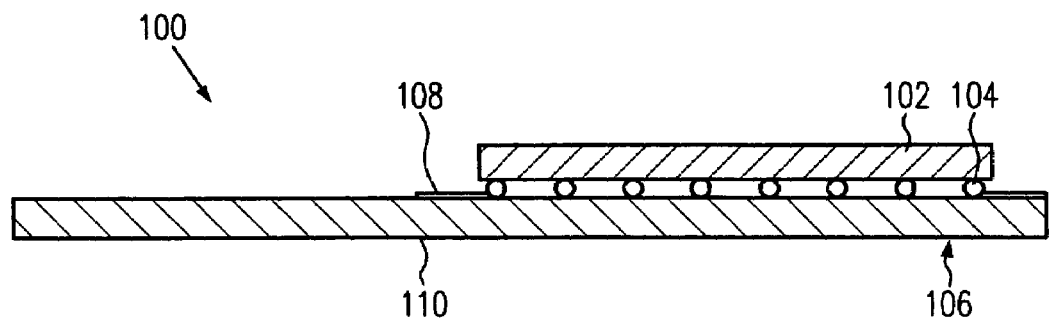
FIG. 1 shows a sectional view of a flip chip bonded system according to the prior art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
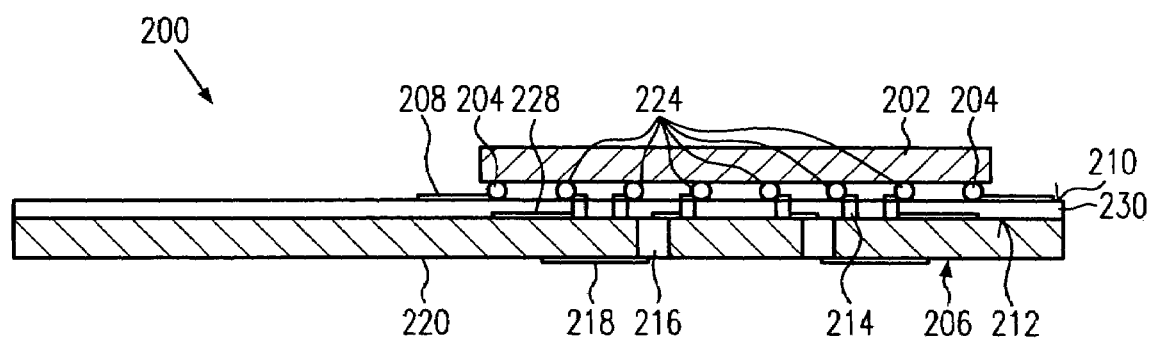
FIG. 2 shows a sectional view of a flip chip bonded system according to the present invention.

With reference to FIGS. 2-5, further illustrative embodiments of the present invention will now be described in more detail. FIG. 2 schematically represents a sectional view of an embodiment of a system 200 in accordance with the present invention. A chip 202 is flip chip bonded onto a carrier 206 by peripheral bonds 204 and inner bonds 224. The carrier 206 comprises a first (upper) signal wiring layer 210, a second (intermediate) signal wiring layer 212 electrically isolated by a dielectric layer 230 from the first (upper) signal wiring layer 210, and a power supply (lower) layer 220. The peripheral I/Os of the chip 202 are routed out on the first (upper) wiring layer 210 by means of conductive lines 208. The inner signal I/Os of the chip 202 are routed out on the second (intermediate) wiring layer 212 by means of first vias 214 and conductive lines 228. The power supply lines may further be routed out by additional power supply vias 216 on the power supply layer 220 by means of serially connected first vias 214, power supply vias 216 and conductive lines 218. Since the smaller first vias are bridging only a short distance between the upper and the lower signal wiring layer, the additional electrical resistance introduced by a first via may also be acceptable for high power applications. In one embodiment, the ratio of the diameter of the power supply via and of the diameter of the first via is approximately 1.8 or higher. In a further embodiment, all peripheral I/Os (peripheral bumps) are routed out on the upper wiring layer, and all inner I/Os (inner bumps) are routed out on at least one additional wiring layer by means of vias.

Figure 3:
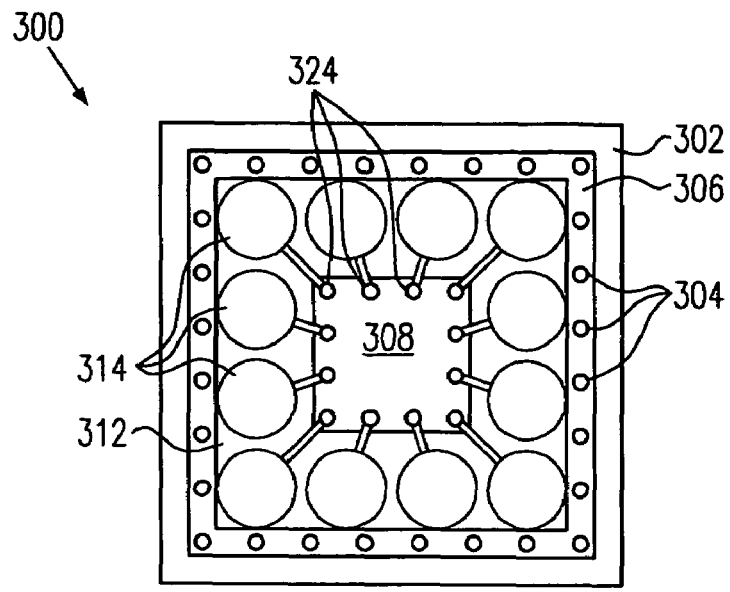
FIG. 3 represents a plan view of a carrier bond layout according an embodiment of the present invention.

FIG. 3 depicts a chip bond layout 300 of a chip carrier according to one embodiment of the present invention comprising only a single type of vias, for example, the first vias 214 or the power supply vias 216. The chip mounting region 302 indicates the area bearing the chip after flip chip bonding. The peripheral bump region 306 is disposed in the periphery of the chip mounting region 302 with a spacing to the edges of the chip mounting region 302, and the inner bump region 308 is disposed within the peripheral bump region 306 and separated therefrom by an area that serves as the via region 312. The inner bump region and/or the peripheral bump region may be arranged concentrically. Each inner bump 324 disposed in the inner bump region 308 is connected to at least one via 314, arranged in the via region 312. The peripheral bumps 304 are disposed in the peripheral bump region 306. In one embodiment, the ratio of the number of inner bumps to the number of peripheral bumps is less than 0.8.

The peripheral I/Os may be readily routed out on the upper wiring layer 210, in particular, when a single row peripheral I/O arrangement is employed. When the peripheral I/Os, however, are arranged in two or more rows in the peripheral bump region, the outer row is provided with the required spacing to route the inner row I/Os out between the bump pads of the outer row. Since each inner bump 324 is connected to a via 314, each inner I/O may readily be routed out on an additional wiring layer 212 formed by a further conductive layer, electrically isolated from the upper wiring layer 210 by the intermediate dielectric layer 230, in the chip carrier 206 as shown in FIG. 2. In one embodiment, the vias may be arranged in the via region with as small a spacing that is compatible with the carrier technology design rules to achieve a high I/O density.

Figure 4:
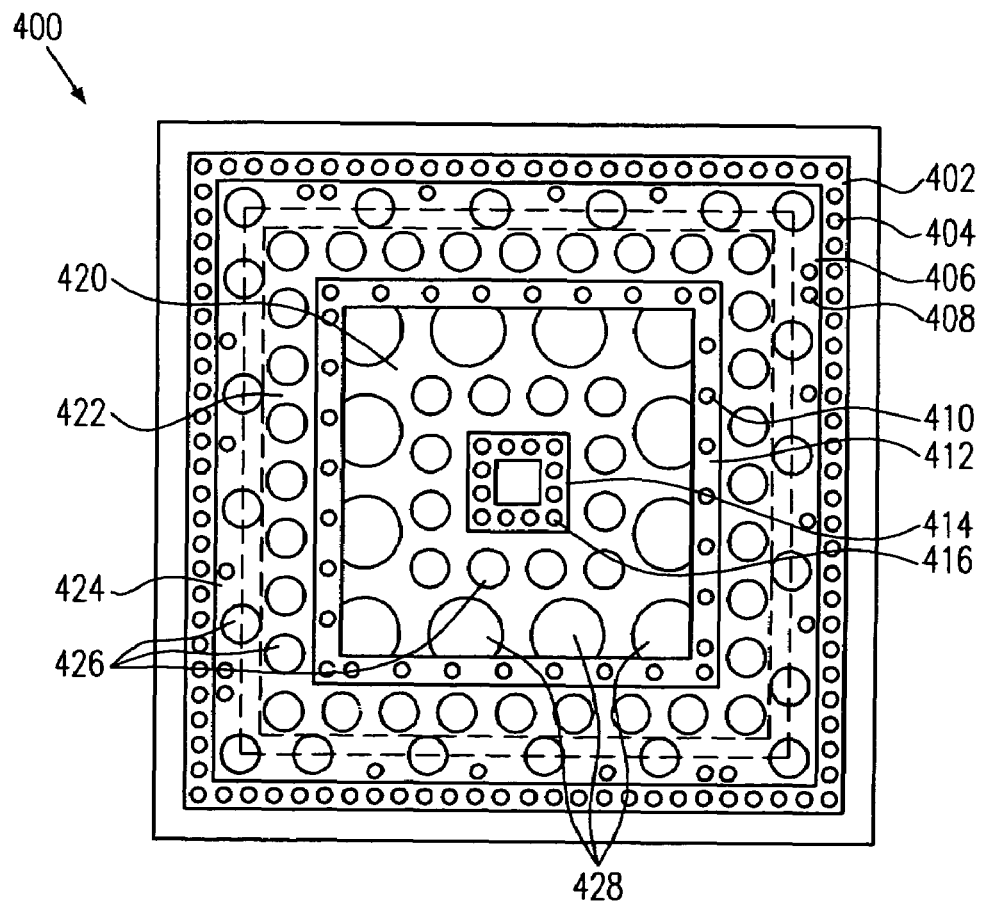
FIG. 4 represents a plan view of a bump layout and of a via layout of a carrier according to another embodiment of the present invention.

FIG. 4 depicts a bump layout and a via layout of a chip carrier according to a further embodiment of the present invention. A peripheral bump region 402 may be arranged like in the embodiment shown in FIG. 3. An inner bump region, however, is divided in at least three regions 414, 412, 406 so that inner bumps 408, 410, 416 are disposed in the at least three separate regions, an inner region 414, an intermediate region 412 and an outer region 406. The width of the three separate regions 414, 412, 406 depends on the bump pad diameter and comprises an additional clearance to allow for a reliable bond process. The at least three separate regions 414, 412, 406 may be arranged concentrically. The intermediate region 412 may comprise one or more sub-regions (not shown) which may be arranged between the inner region and the outer region and may provide additional bumps which may be connected to additional vias (not shown) disposed on one or both sides of the one or more sub-regions. The outer region 406 is abutting the peripheral bump region 402. The intermediate region 412 is disposed between the inner region 414 and the outer region 406 separated therefrom by an inner via region 420 and by an outer via region 422, 424.

The outer via region comprises two abutting via regions, i.e., an intermediate via region 422 disposed adjacent to the intermediate region 412 and a peripheral via region 424 disposed adjacent to the peripheral bump region 402. The first vias in the intermediate via region 422 are connected to the inner bumps 410 of the intermediate region 412 and the first vias in the peripheral via region 424 are connected to the inner bumps 408 of the outer region 406. The outer region 406 may overlay the peripheral via region 424, when the bump and via density in both regions is low as shown in FIG. 4. The intermediate region 412 may overlay the inner via region 420 in the case that the inner bumps of the inner region 414 are serially connected to first vias 426 and power supply vias 428 since the first vias 426 route the power supply lines down to the upper pads of the power supply vias 428 disposed in the second (intermediate) signal wiring layer 212 so that the intermediate (bump) region 412 on the upper wiring layer 210 may overlap the inner via region 420 in the area where power supply vias are disposed as shown in FIG. 4. Contrary thereto, the inner via region 420 and the intermediate region 412 may be arranged in a non-overlaying manner, for example, when no power supply vias are employed. The peripheral via region 424 and the outer region 406 may also be arranged in a non-overlaying manner, when the bump and/or the via density in the regions 424, 406 is too high for overlaying.

Figure 5:
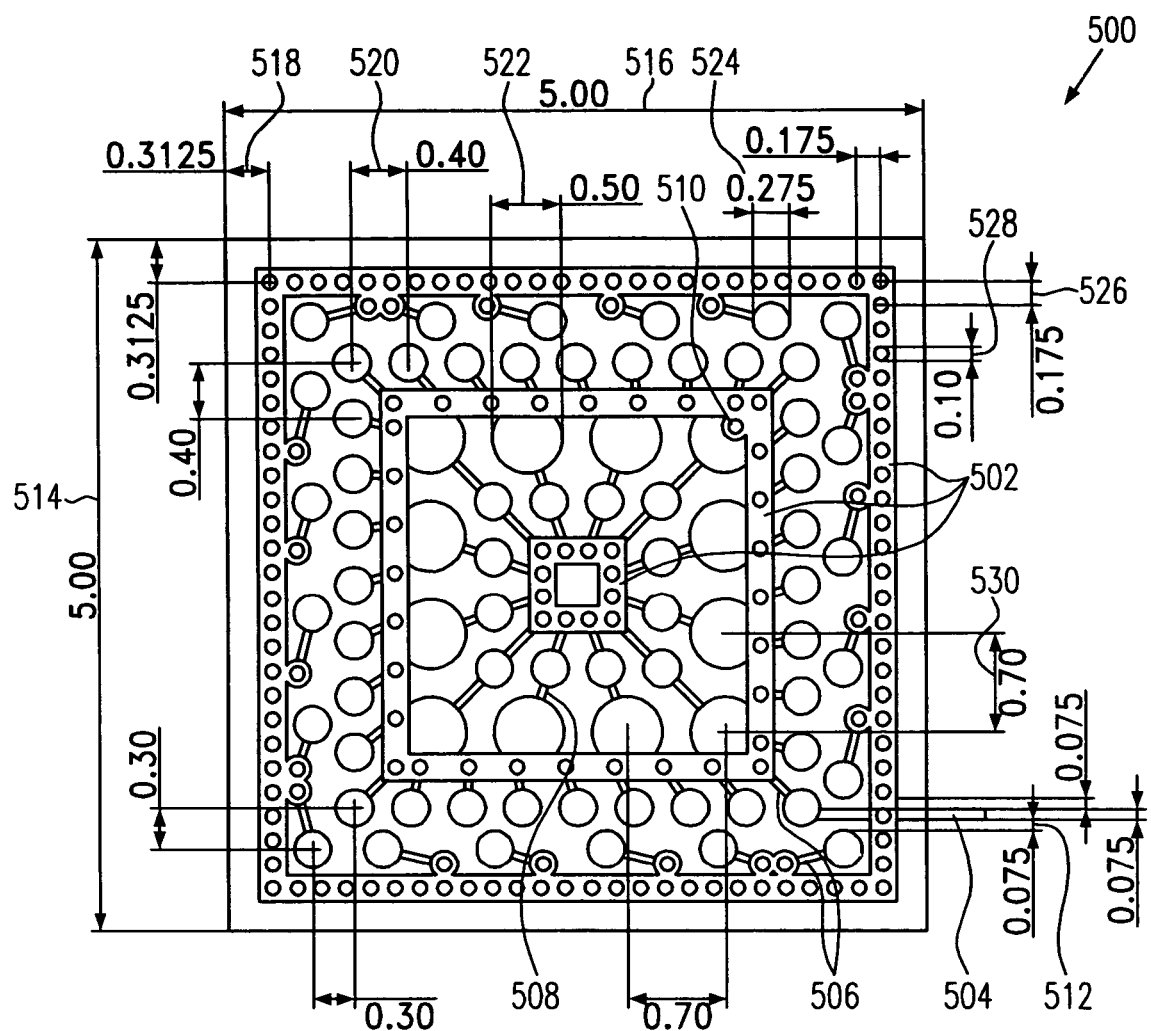
FIG. 5 represents a plan view of the complete carrier bond layout relating to the embodiment of FIG. 4 and being adapted to currently achievable FR4 printed circuit board design rules.

FIG. 5 represents the complete bond layout of the embodiment depicted in FIG. 4 that is further adapted to a currently available FR4 printed circuit board technology. All measures provided are in millimeter (mm). That means a minimal trace width 504 and a minimal clearance width 512 is approximately 75 μm. Thus, the clearance between two adjacent first vias in the peripheral via region is larger then approximately 0.225 mm to route the first vias of the intermediate via region reliably out. The bump pad diameter 528 is approximately 0.1 mm and the bump pitch 526 in the peripheral bump region is approximately 0.175 mm. The pad diameter 524 of the first via is approximately 0.275 mm and the first via pitch 520 in the intermediate via region is approximately 0.4 mm. The pad diameter 522 of the power supply via is approximately 0.5 mm and the corresponding pitch 530 is approximately 0.7 mm. The holes drilled through the corresponding dielectric layers separating the wiring layers have a diameter of approximately 0.1 mm for the first vias and a diameter of approximately 0.2 mm for the power supply vias. A size 514, 516 of the chip, and hence of the chip mounting region, is approximately 5×5 mm. A spacing 518 between the center of the peripheral bumps and the edge of the chip mounting region is approximately 0.3125 mm. The bond layout further comprises an orientation bump 510 disposed at the inner corner of the intermediate region to facilitate the chip to carrier alignment during flip chip bonding. The total number of bumps may be 165, wherein 152 bumps may relate to signal I/Os. One hundred bumps thereof are disposed in the peripheral bump region and 52 are disposed in the outer region 406 and in the intermediate region 412. The 12 power supply bumps are disposed in the inner region 414. The bump pads are electrically connected to the upper pads of the first vias by conductive lines 506 on the upper signal wiring layer, and the lower pads of the first vias are connected to the upper pads of the power supply vias by conductive lines 508 on the lower signal wiring layer. The conductive lines 506 are only partially shown in FIG. 5 since the conductive lines 506 may partially be covered by a solder mask 502. The solder mask 502 improves the reliability of the solder bond process since the solder mask stops the detrimental flow of the solder material during the bump process.

The arrangement chosen for the bumps allows the cost-effective usage of simple block solder masks 502, i.e., a single solder mask is employed for a plurality of bumps. In a particular embodiment, at least one block solder mask is employed to prevent the flow of the bump solder material along the conductive lines. In a further embodiment, the at least one block solder mask comprises three block solder masks corresponding to the inner region, to the intermediate region and to the outer/peripheral bump region. The outer region and the peripheral bump region may have a single common block solder mask. The block solder masks may be concentrically arranged according to the arrangement of the corresponding bump regions.

As a result, the present invention provides a space efficient chip carrier for flip chip application that may advantageously be provided as a low cost FR4 chip carrier. The provided bump layout and the provided via layout allow, in one embodiment, disposition of the highest possible number of I/Os for a predefined chip size and a predefined carrier technology.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A chip carrier for flip chip bond application, comprising:
    a first wiring layer;
    a second wiring layer;
    a plurality of bumps disposed on said first wiring layer;
    a first portion of said plurality of bumps representing peripheral bumps and being routed out by said first wiring layer, said peripheral bumps defining a contiguous peripheral bump region;
    a second portion of said plurality of bumps representing inner bumps defining an inner bump region and being routed out by said first and second wiring layers; and
    at least one via for each inner bump, at least a first portion of said vias being disposed in a first via region, wherein said peripheral bump region surrounds said first via region and said inner bump region and said first via region is disposed between said peripheral bump region and an outer bump region.

2. The chip carrier of claim 1, further comprising said inner bump region, said peripheral bump region and said via region being arranged in a chip mounting region.

3. The chip carrier of claim 1, wherein said plurality of bumps disposed on said first wiring layer comprises only peripheral bumps and inner bumps.

4. The chip carrier of claim 1, wherein said peripheral bumps are arranged in a single row in said peripheral bump region, wherein each peripheral bump is adjacent to two peripheral bumps.

5. The chip carrier of claim 1, wherein said inner bump region comprises an inner region, an intermediate region and an outer region.

6. The chip carrier of claim 5, wherein at least one of said inner region, said intermediate region and said outer region is a concentrically arranged region.

7. The chip carrier of claim 5, wherein said outer region is disposed adjacent to said peripheral bump region.

8. The chip carrier of claim 5, wherein at least a second portion of said vias is disposed in a second via region defined by said inner region and said intermediate region.

9. The chip carrier of claim 8, wherein said first via region comprises an intermediate via region adjacent to said intermediate region and a peripheral via region adjacent to said peripheral bump region.

10. The chip carrier of claim 8, wherein each inner bump of said inner region is connected to a first via disposed in said inner via region.

11. The chip carrier of claim 10, wherein each first via disposed in said inner via region is further connected to a second via disposed in said inner via region.

12. The chip carrier of claim 11, wherein the diameter of said second via is greater than the diameter of said first via.

13. The chip carrier of claim 9, wherein each inner bump of said intermediate region is connected to a first via disposed in said intermediate via region.

14. The chip carrier of claim 9, wherein each inner bump of said outer region is connected to a first via disposed in said peripheral via region.

15. The chip carrier of claim 9, wherein the bumps and the first and second via are arranged to provide for a predetermined carrier technology the maximum number of electrically connected bumps.

16. The chip carrier of claim 1, wherein the chip carrier material comprises FR4.

17. The chip carrier of claim 1, further comprising a power supply layer.

18. The chip carrier of claim 17, wherein conductive lines from the inner bumps of the inner region are routed out by the power supply layer.

19. The chip carrier of claim 1, further comprising a solder mask.

20. The chip carrier of claim 19, wherein said solder mask comprises at least one block solder mask to block the flow of the solder material of a plurality of bumps.

21. The chip carrier of claim 20, wherein said at least one block solder mask is concentrically arranged on the chip mounting region.

* * * * *